(12) United States Patent
Akers et al.

(10) Patent No.: US 10,401,423 B2
(45) Date of Patent: Sep. 3, 2019

(54) THERMAL CONTROL USING PHASE-CHANGE MATERIAL

(71) Applicant: Teradyne, Inc., North Reading, MA (US)

(72) Inventors: Larry Akers, Westford, MA (US); Joseph Wrinn, Winchester, MA (US); Philip Campbell, Bedford, NH (US); David Graziose, Allston, MA (US)

(73) Assignee: Teradyne, Inc., North Reading, MA (US)

( * ) Notice: Subject to any disclaimer, the term of this patent is extended or adjusted under 35 U.S.C. 154(b) by 154 days.

(21) Appl. No.: 15/145,136

(22) Filed: May 3, 2016

(65) Prior Publication Data

US 2017/0322253 A1 Nov. 9, 2017

(51) Int. Cl.
*G01R 31/28* (2006.01)
*G01R 31/26* (2014.01)

(52) U.S. Cl.
CPC .............................. *G01R 31/2874* (2013.01)

(58) Field of Classification Search
CPC ................................................ G01R 31/2874
See application file for complete search history.

(56) References Cited

U.S. PATENT DOCUMENTS

| | | | | |
|---|---|---|---|---|
| 2003/0062888 A1* | 4/2003 | Magliocco | ....... | G01R 31/31903 324/750.08 |
| 2005/0200376 A1* | 9/2005 | Yee | ..................... | G01R 31/2875 324/750.01 |
| 2011/0267084 A1* | 11/2011 | Erwin | ................ | G01R 31/2884 324/750.09 |
| 2013/0283827 A1 | 10/2013 | Wang et al. | | |
| 2014/0253157 A1* | 9/2014 | Dean | ........................ | G01R 1/44 324/750.09 |
| 2015/0003007 A1 | 1/2015 | MacDonald et al. | | |

(Continued)

FOREIGN PATENT DOCUMENTS

KR 2012-0058070 A 6/2012
KR 2015-0045690 A 4/2015
(Continued)

OTHER PUBLICATIONS

Pluss, savE—HS 23N, Phase Change Material, Technical Data Sheet, 2 pages (Oct. 2012).
(Continued)

*Primary Examiner* — Christopher P McAndrew
*Assistant Examiner* — Zannatul Ferdous
(74) *Attorney, Agent, or Firm* — Choate, Hall & Stewart LLP

(57) ABSTRACT

An example test system includes: a test slot to hold a device under test (DUT); a temperature control system comprising a phase-change material, with the temperature control system for maintaining a temperature of the phase-change material in a steady-state condition, with the phase-change material changing phase during a transient condition to affect a temperature of a thermally-conductive structure, and with the steady-state condition being longer in duration than the transient condition; and an air mover to direct air over the thermally-conductive structure and towards the DUT in the test slot in order to affect a temperature of the DUT.

25 Claims, 5 Drawing Sheets

(56) References Cited

U.S. PATENT DOCUMENTS

2016/0242598 A1* 8/2016 Alexander .......... A47J 36/2433
2017/0210196 A1* 7/2017 Bidner ............... B60H 1/00492

FOREIGN PATENT DOCUMENTS

KR    2016-0021452 A    2/2016
WO    WO-2014/202521 A1  12/2014

OTHER PUBLICATIONS

International Search Report for PCT/US2017/ 026294, 3 pages (dated Jun. 29, 2017).
Written Opinion for PCT/US2017/ 026294, 11 pages (dated Jun. 29, 2017).
International Preliminary Report on Patentability for PCT/US2017/ 026294, 12 pages (dated Nov. 6, 2018).

* cited by examiner

THERMAL CONTROL USING PHASE-CHANGE MATERIAL

TECHNICAL FIELD

This specification relates generally to a test system that implements thermal control using phase-change material.

BACKGROUND

A phase-change material (PCM) includes a material that melts or solidifies at certain temperatures. In some cases, heat is absorbed by a PCM when the PCM changes from solid to liquid. The heat melts the PCM, turning it into a liquid. In some cases, heat is released by a PCM when the PCM changes from liquid to solid. The heat leaves the PCM, allowing the PCM to cool and to solidify.

SUMMARY

An example test system comprises a test slot to hold a device under test (DUT); a temperature control system comprising a phase-change material, with the temperature control system for maintaining a temperature of the phase-change material in a steady-state condition, with the phase-change material changing phase during a transient condition to affect a temperature of a thermally-conductive structure, and with the steady-state condition being longer in duration than the transient condition; and an air mover to direct air over the thermally-conductive structure and towards the DUT in the test slot in order to affect a temperature of the DUT. The example test system may include one or more of the following features, either alone or in combination.

The temperature control system may comprise a cooling loop to reduce the temperature of the DUT, with the cooling loop comprising: tubing to transport liquid to and from the test slot, with the tubing containing the liquid passing proximate to the phase-change material to allow the phase-change material to cool the liquid, and with the phase change material melting to cool the liquid during the transient condition; and a cooling system to cool the liquid. The tubing containing the liquid may pass through or around the phase-change material.

The temperature control system may be configured to actively control a temperature of a liquid passing in proximity to the phase-change material to enable the thermally-conductive structure to reach a minimum temperature during the transient condition; and the cooling system may be configured to cool the phase-change material during the steady-state condition. The cooling system may have a capacity that is less than would be required to enable the thermally-conductive structure to reach the minimum temperature during the transient condition absent the phase-change material. The liquid may comprise a heat transfer fluid.

The temperature control system may comprise a heating loop to increase the temperature of the DUT, with the heating loop comprising: tubing to transport liquid to and from the test slot, with the tubing containing the liquid passing proximate to the phase-change material to allow the phase-change material to add heat to the liquid, and with the phase change material solidifying to add the heat to the liquid during the transient condition; and a heating system to heat the liquid. The tubing containing the liquid may pass through or around to the phase-change material.

The temperature control system may be configured to actively control a temperature of a liquid in proximity to the phase-change material to enable the thermally-conductive structure to reach a maximum temperature during the transient condition; and the heating system is configured to add the heat to the phase-change material during the steady-state condition. The heating system may have a capacity that is less than would be required to enable the thermally-conductive structure to reach the maximum temperature during the transient condition absent the phase-change material. The liquid may comprise a heat transfer fluid.

The thermally-conductive structure may comprise one or more metal plates; and the test slot may comprise a shroud to direct air from the air mover over the DUT. The phase-change material may comprise a hydrated salt or an organic compound.

The test system may also comprise a group of test slots, which includes the test slot holding the DUT. Each test slot in the group of test slots may comprise a thermally-conductive structure having a temperature that is affected by a temperature of the phase change material. Each test slot in the group of test slots may comprise an air mover to direct air over a corresponding thermally-conductive structure and towards a DUT in order to affect a temperature of the DUT. The test system of may comprise a temperature sensor to detect a temperature of the DUT; and a control loop to control operation of the air mover based on the temperature detected.

The temperature control system comprising the phase-change material may enable the thermally-conductive structure to reach a target temperature at a quicker rate during the transient condition than would be reached by the temperature control system absent the phase-change material. The temperature control system comprising the phase-change material may reduce peak power demand during the transient condition relative to a peak power demand of the temperature control system absent the phase-change material.

An example temperature control system for one or more test slots comprises a cooling loop for one or more test slots, with the cooling loop comprising a first liquid and a first phase-change material, with the first phase-change material to remove heat from the first liquid during a first transient condition, with the cooling loop comprising a cooling system to cool the first liquid during a first steady-state condition, and with the first steady state condition being longer in duration than the first transient condition. The example temperature control system also comprises a heating loop for one or more test slots, with the heating loop comprising a second liquid and a second phase-change material, with the second phase-change material to add heat to the second liquid during a second transient condition, with the heating loop comprising a heating system to add heat to the second liquid during a second steady-state condition, and with the second steady state condition being longer in duration than the second transient condition. The example temperature control system may include one or more of the following features, either alone or in combination.

Each test slot may comprise: a thermally-conductive structure having a temperature that is controlled by the heating loop or the cooling loop; and an air mover to direct air over the thermally-conductive structure and towards a device in the test slot in order to affect a temperature of the device.

The cooling system may have a capacity that is less than would be required to enable the thermally-conductive structure to reach a minimum temperature during the first transient condition absent the first phase-change material. The heating system may have a capacity that is less than would be required to enable the thermally-conductive structure to reach a maximum temperature during the second transient condition absent the second phase-change material.

The first phase-change material may be different from the second phase-change material. The cooling loop may be controlled to cool the device at a rate between 3° C. per minute and 15° C. per minute, inclusive; and the heating loop may be controlled to heat the device at a rate between 3° C. per minute and 15° C. per minute, inclusive. The cooling loop may be controlled to cool the device at a rate of about 10° C. per minute; and the heating loop may be controlled to heat the device at a rate of about 10° C. per minute. The first phase-change material may have a composition that enables reaching a temperature of about −23° C.; the second phase-change material may have a composition that enables reaching a temperature of about +80° C.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and computer memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are examples of systems for implementing thermal control using phase change material (PCM). As explained above, a (PCM) includes material that melts or solidifies at certain temperatures. In some cases, heat is absorbed by a PCM when the PCM changes from solid to liquid. The heat melts the PCM, turning it into a liquid. In some cases, heat is released by a PCM when the PCM changes from liquid to solid. The heat leaves the PCM, allowing the PCM to cool and to solidify. Different PCMs may be used for heating and cooling, as described herein.

A PCM stores thermal energy according to a property called heat of fusion. The temperature of the PCM does not change when the PCM is changing state (e.g., melting or solidifying). A reason for employing PCMs in the context of the example temperature control systems described herein is to manage a high demand for thermal power (watts) by spreading out energy (joules) demand over time. For example, the PCM enables peak demand on a temperature control system by storing thermal energy in the PCM over a relatively long period of time, and then allowing the stored thermal energy from the PCM to be released (heat of fusion) quickly (e.g., at a relatively high power) into a test chamber. The PCM thus has a smoothing effect on the peak thermal power demand. In some implementations, this can be achieved without the use of over-capacity heating or cooling systems, thereby reducing test system size and/or cost.

The example thermal control systems are described in the context of test systems, such as automatic test equipment (ATE). For instance, the thermal control systems may be used in a test system for testing storage devices, such as solid state drives (SSDs). In general, SSDs include devices that use integrated circuit assemblies as memory for persistent storage of data. As distinguished from hard disk drives (HDDs), SSDs typically do not include moving mechanical components, such as a spinning magnetic disk. Although the example thermal control systems herein are described in the context of an SSD test system, the thermal control systems may be employed in any appropriate context to heat and/or to cool any appropriate system. For example, the thermal control systems may be used to control the temperature of an HDD test system, to control the temperature of non-test electronics, and so forth.

Figure 1:
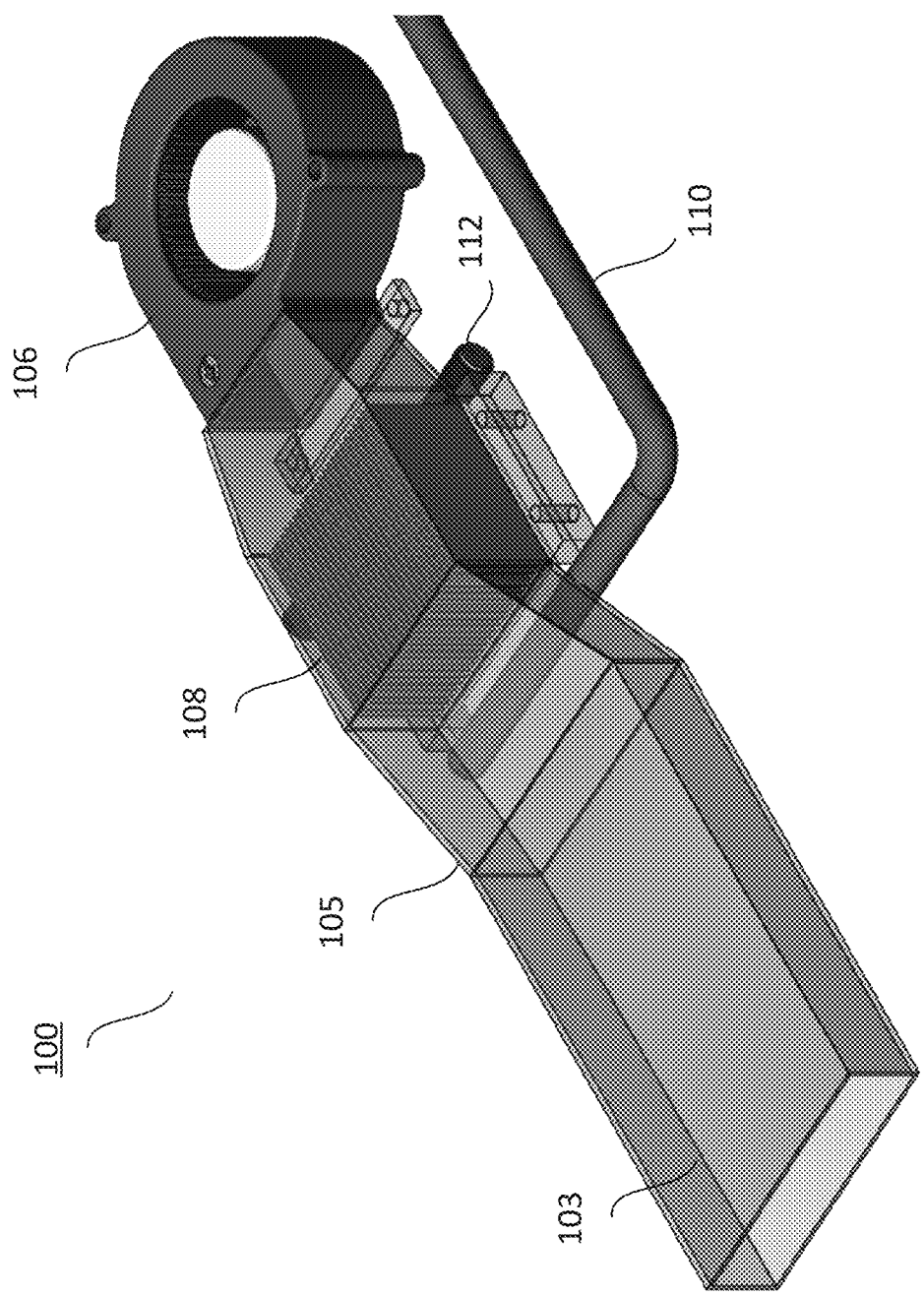
FIG. 1 is a perspective view of an example test slot.
Figure 2:
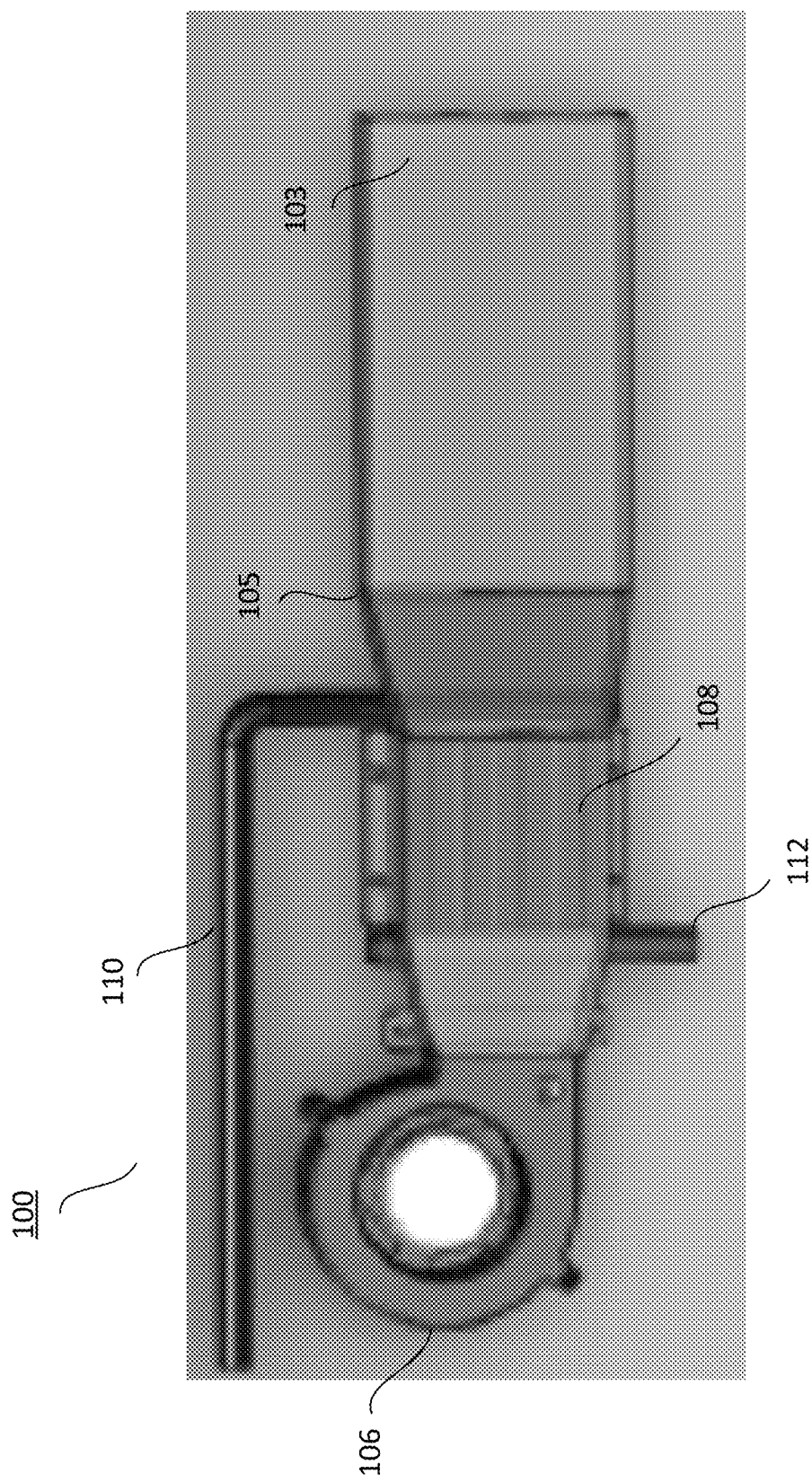
FIG. 2 is a top view of the example test slot of FIG. 1.
Figure 3:
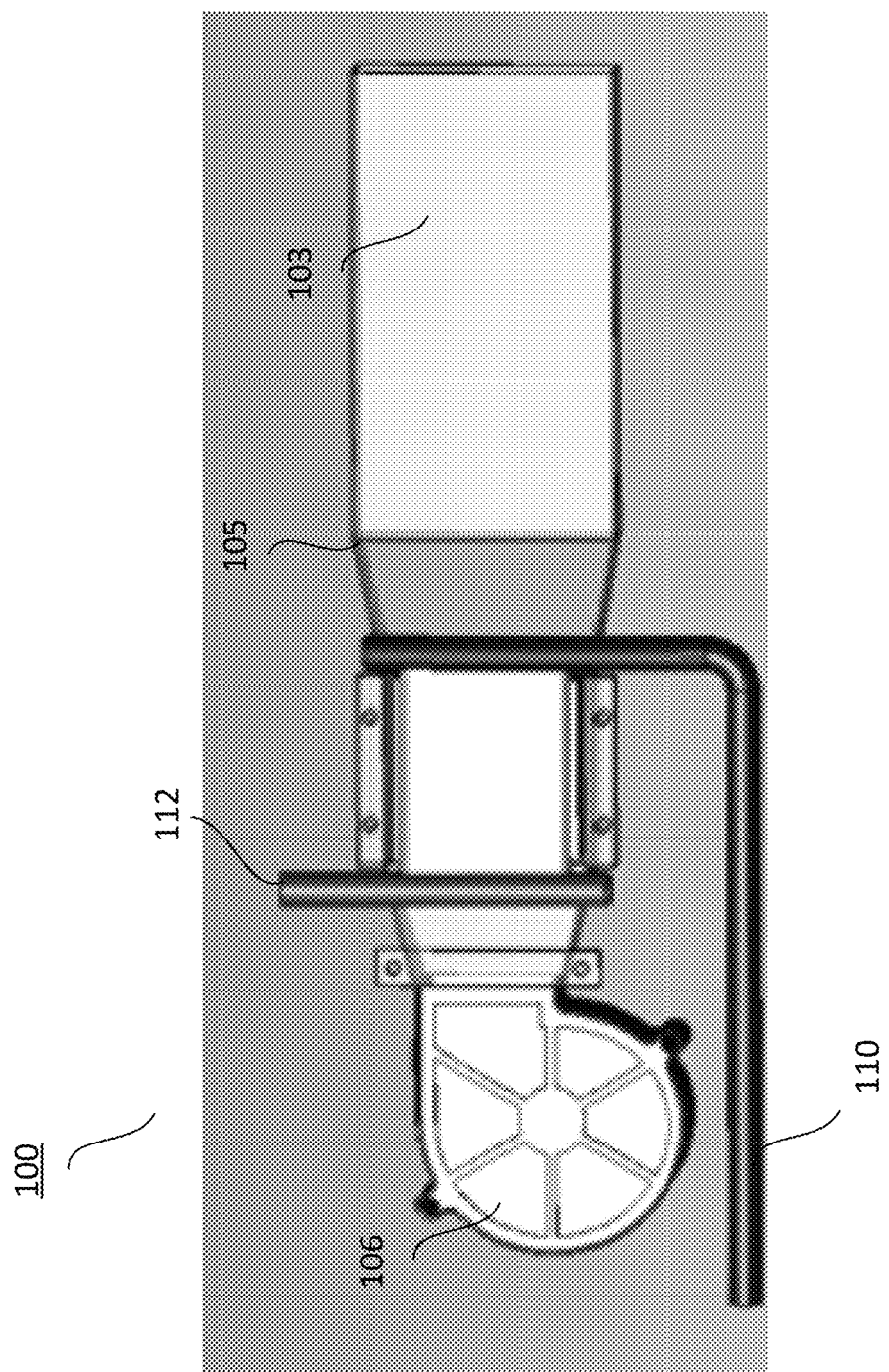
FIG. 3 is a bottom view of the example test slot of FIG. 1.
Figure 4:
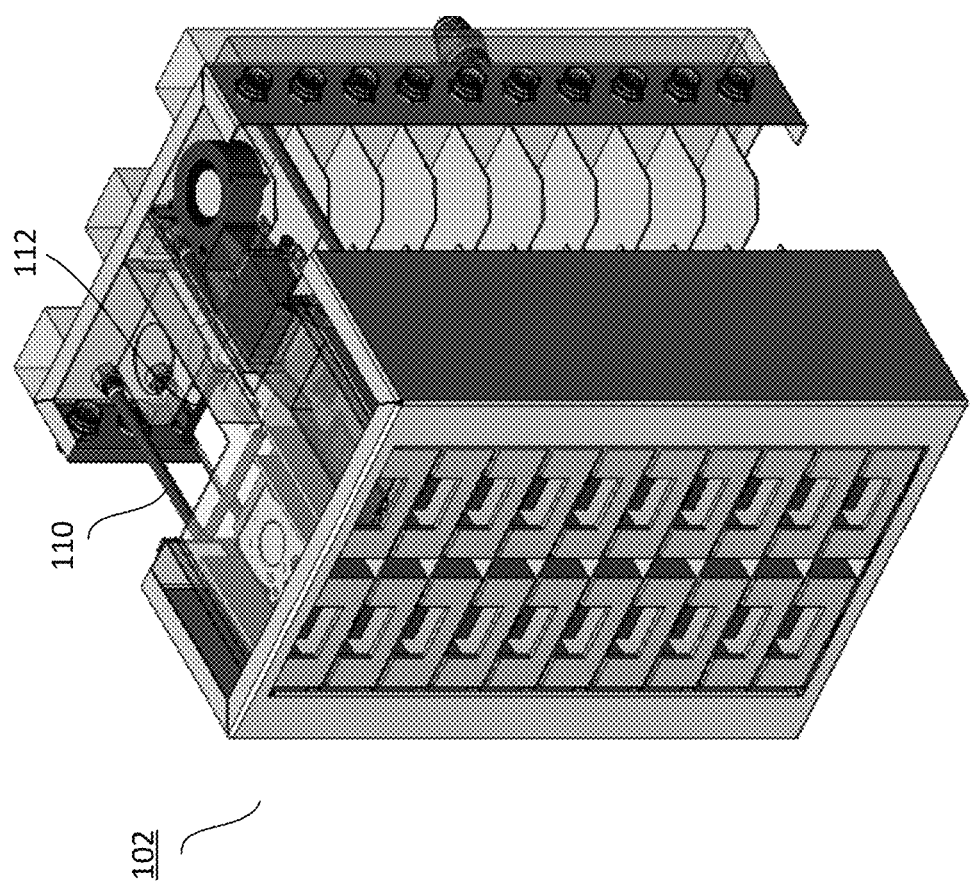
FIG. 4 is a perspective view of an example pack of test slots.

FIGS. 1 to 3 show different views of an example test slot 100 that houses an SSD for testing. As described herein, test slot 100 may be part of a pack (or group) 102 (FIG. 4) of test slots that are serviced by automated machinery, such as one or more robots. For example, a robot may move an untested SSD into chamber 103 of test slot 100. The SSD may be tested while in the chamber. Following testing, the robot may move the tested SSD out of the chamber, and replace it with an untested SSD. Among the tests that may be performed on an SSD in the test slot are thermal tests. For example, as part of the testing process, the SSD may be subjected to heating and cooling, and to various rates of heating and cooling. In some example tests, the rate of temperature change for heating and/or cooling of the SSD may be between 3° C./minute and 15° C./minute, inclusive (e.g., 3° C./minute, 4° C./minute, 5° C./minute, 6° C./minute, 7° C./minute, 8° C./minute, 9° C./minute, 10° C./minute, 11° C./minute, 12° C./minute, 13° C./minute, 14° C./minute, 15° C./minute). Rates of temperature change other than those listed herein may also be achieved using the systems described herein.

Heretofore, in order to achieve relatively high rates of temperature change, such as those described above, a thermal control system had to be over-capable. That is, the thermal control system had to have more capacity for heating and/or cooling than would be required to implement a required temperature change for a given device at slower rates. For example, if a relatively high rate of cooling was required, a cooling system had to have a relatively high capacity in relation to the required amount of cooling. In some cases, the capacity could be as much as three times that which would normally be required to achieve the cooling. Through use of a PCM, the cooling system may have a capacity that is less than would be required to enable a thermally-conductive structure to reach a specified minimum temperature within a predefined time absent the PCM. In another example, if a relatively high rate of heating was required, a heating system had to have a relatively high capacity in relation to the required amount of heating. Through use of a PCM, the heating system may have a capacity that is less than would be required to enable the thermally-conductive structure to reach a predefined maximum temperature within a predefined time absent the PCM.

As shown in FIGS. 1 to 3, test slot 100 includes a shroud 105, an air mover 106, a thermally-conductive structure 108, and connections to a heating loop 110 and to a cooling loop 112. Although the connections to heating loop 110 and cooling loop 112 appear broken in FIGS. 1 to 3, they actually form continuous loops, through which heat transfer liquids pass, as shown, e.g., in FIG. 5. The heating and cooling loops include, respectively, heating and cooling systems, as described herein.

Air mover 106 may be a blower, fan, or any other appropriate type of device for directing air over a device under test (DUT) in chamber 103. In this example, the DUT is an SSD as explained above, however, any appropriate DUT may be used. In this example, thermally-conductive structure 108 includes one or more metal plates, which conduct thermal energy from either the heating loop 110 or the cooling loop 112. In some implementations, the heating and cooling loops operate out of phase (e.g., they do not operate at the same time). As a result, by operation of either the heating loop or the cooling loop, thermally-conductive structure 108 either increases in temperature or decreases in temperature. Air from the air mover passes over the thermally-conductive structure, which causes the air to increase or to decrease in temperature. The air then passes through shroud 105, and over the DUT. The DUT is thus heated, or cooled, to an desired temperature at a desired rate.

One or more temperature sensors (not shown) may be placed on, or adjacent to, the DUT in chamber 103. These temperature sensors may be used to detect, e.g., in real-time, the temperature of, or around, the DUT, and to report that temperature back to a computing device. In some implementations, the computing device may include a controller, such as a microprocessor, resident on a circuit board in the test slot. In some implementations, the computing device may include a central computer that directs operations of the entire test system, including the operation of multiple slots, robots, feeding stations, and so forth. The computing device may be programmed to implement a control loop to regulate operation of the air mover, the heating system, and/or the cooling system based on the temperature detected by the sensors. In some implementations, the control loop may include a proportional—integral—derivative controller (PID controller). Generally, the PID controller continuously calculates an error value as a difference between a desired temperature and a detected temperature. The controller attempts to reduce (e.g., minimize) that error over time by adjusting a control variable, such as the temperature supplied by the heating cool or the cooling loop (e.g., by adjusting the amount power supplied to the heating or cooling loop). By appropriately controlling the heating or cooling loops, the DUT temperature can be maintained, and changed at desired rates, to implement one or more thermal tests. In some implementations, the power to the air mover may be adjusted to increase or to decrease the air flow over the DUT, thereby affecting its temperature.

Figure 5:
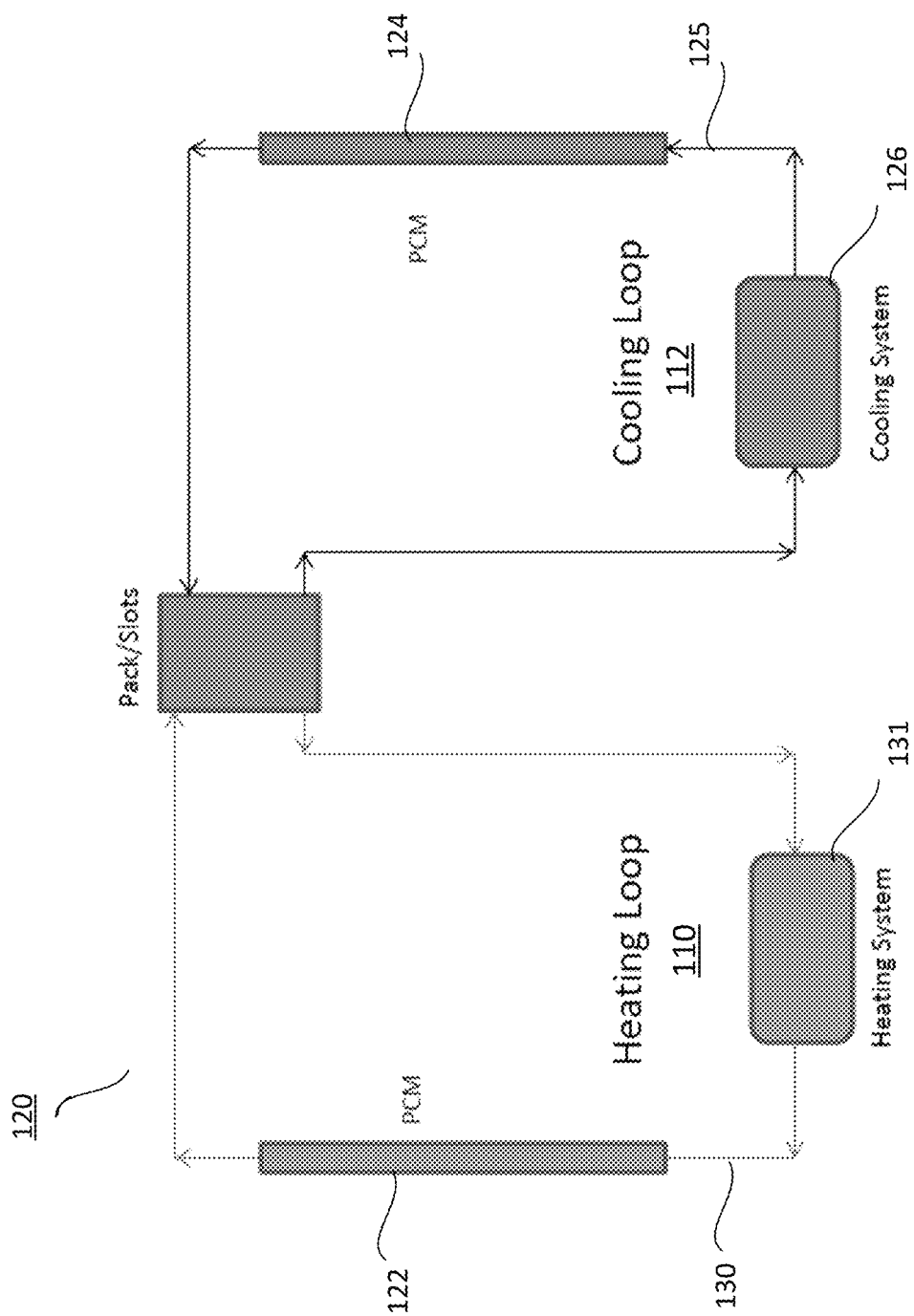
FIG. 5 is a block diagram of an example temperature control system.

FIG. 5 shows an example of a temperature control system 120 that includes PCMs 122 and 124. The temperature control system is configured to maintain a temperature of a PCM in a steady-state condition. The PCM changes phase during a transient condition to affect a temperature of a thermally-conductive structure, such as structure 108 of FIG. 1. The steady-state condition is typically longer in duration than the transient condition. In an example, the transient condition includes a time during which the DUT is to be heated or cooled at specified rates, e.g., between 3° C./minute and 15° C./minute. Temperature changes such as these may occur during testing only and, therefore, are considered transient. By contrast, the steady-state condition includes times between temperature changes required for testing. During the steady-state condition, in effect, the PCM is thermally charged, as described herein, to enable the PCM to implement, or assist, in cooling or heating that is performed during the transient conditions. As a result of this charging, lower-capacity heating and/or cooling systems may be used than would otherwise be required to implement the same rate of cooling or heating (e.g., the same amount of cooling in a given time).

In operation, temperature control system 120 is configured to actively control a temperature of a liquid passing in proximity to (e.g., through or around) the PCM to enable the thermally-conductive structure to reach a specified temperature during the transient condition. Temperature control system 120 includes a cooling loop 112 to cool the one or more test slots. The cooling loop includes a first liquid 125 (in a tubing) and a first PCM 124, with the first PCM for removing heat from the first liquid during a first transient condition. The cooling loop also includes a cooling system 126 to cool the first liquid during a first steady-state condition, with the first steady state condition being longer in duration than the first transient condition. Temperature control system 120 also includes a heating loop 110 to heat the one or more test slots. The heating loop includes a second liquid 130 (in a tubing) and a second PCM 122, with the second PCM for adding heat to the second liquid during a second transient condition. The heating loop includes a heating system 131 to add heat to the second liquid during a second steady-state condition, with the second steady state condition being longer in duration than the second transient condition.

In the example of FIG. 5, cooling loop 112 includes tubing to transport liquid to and from a test slot or a pack of test slots in a circulating loop. The tubing is made of a thermally-conductive material, such as metal, which permits transmission of heat between the liquid contained therein and PCM 124. The liquid may be any appropriate heat transfer fluid that is capable of extracting heat from PCM 124, thereby cooling the PCM. In this way, the PCM is thermally charged during the steady-state condition. Examples of heat transfer fluids that may be used include, but are not limited to, water, ethylene glycol, hydrofluoroether (HFE), liquid nitrogen ($N_2$), or appropriate combinations thereof. For example, in an implementation, the heat transfer fluid is a mixture of water and ethylene glycol containing 60% ethylene glycol and 40% water. In other implementations, the heat transfer fluid may be a mixture of water and ethylene glycol containing 50% ethylene glycol and 50% water, or some other appropriate percentages of water and ethylene glycol.

The tubing containing the liquid passes proximate to PCM 124 to allow heat transfer to occur between the liquid and the PCM. For example, the tubing may pass through the PCM such that the tubing is surrounded by the PCM. During the steady state condition, the liquid in the tubing extracts heat from the PCM. As a result, during the steady state condition, the PCM cools and solidifies at its freezing temperature. In this example, the cooling system cools the liquid (or provides pre-cooled liquid, such as liquid nitrogen). The cooled liquid passes through thermally-conductive tubing, which passes in proximity to (e.g., through or around) PCM 124. The cooled liquid extracts heat from the PCM over time, during the steady state condition, eventually causing the PCM to freeze. Because the PCM is cooled over a relatively long period of time (e.g., the duration of the steady state condition), the capacity of the cooling system need not accommodate spikes in demand, such as those which may occur during transient conditions. As a result, the cooling system can be of lower capacity than would otherwise be required to achieve the spikes in demand that occur during the transient conditions. For example, the cooling system may be smaller in size and less costly than cooling systems that have to accommodate spikes in demand that may occur during the transient condition.

Cooling system 126 may include any appropriate system that is capable of cooling the liquid to a temperature that is sufficient to enable the liquid to absorb heat from the PCM. In some implementations, the cooling system may be an active refrigeration system that cools the liquid as it passes through the system. In some implementations, the cooling system may include a liquid nitrogen ($N_2$) source, that uses liquid nitrogen as the heat transfer liquid. Other types of heat transfer liquids and cooling systems may be used in addition to, or instead of, these.

Any appropriate PCM may be used in the cooling loop. The PCM may include hydrated salts or organic compounds that have amounts of heat energy stored in the form of latent heat, which is absorbed or released when the materials change state from solid to liquid or liquid to solid. In an example, the PCM retains its latent heat without significant change in physical or chemical properties over numerous (e.g., thousands) of cycles. Appropriate specific temperature PCM's include PCMs that vary, e.g., between −35° C. and +90° C. In an example, PCMs may be used that vary between −23° C. and +80° C. The PCM may be encapsulated in a polymer, such as polypropylene (PP) or high-density polyethylene (HDPE), or a metal, such as copper or stainless steel.

In an example implementation of cooling loop 112, the PCM is, or includes, savE® HS 23N. This is an inorganic chemical-based PCM having a freezing temperature of −23° C. This PCM stores thermal energy as latent heat in its crystalline form. On changing phase, the latent heat is released or absorbed, allowing the ambient temperature within the system to be maintained. The PCM includes a mix of various salts, additives, and nucleating agents, which allows equilibrium between solid and liquid phases to be attained at the melting point. The PCM continues to absorb heat from the environment while melting, without further increase in temperature.

Referring to FIG. 1, tubing from cooling loop 112 is adjacent to (e.g., in contact with) thermally-conductive structure 108. As a result, when cooled, the tubing conducts heat from thermally-conductive structure 108 into the heat transfer liquid contained in the tubing, thereby cooling thermally-conductive structure 108 to an appropriate low (e.g., desired minimum) temperature.

The cooling loop may be operated in response to a transient condition. For example, the transient condition may be that the DUT in the test slot is to be cooled to a specified minimum temperature at a specified rate (e.g., between 3° C./minute and 15° C./minute). In response, the cooling loop may be controlled, e.g., by a central computing device, to cause the cooling. For example, cooling system 126 may be controlled to cool the heat transfer fluid, and to pump that fluid through the cooling loop. The liquid passes in proximity to (e.g., through or around) PCM 124, which has been previously cooled to its freezing temperature. Heat conducts from the heat transfer fluid to the PCM, thereby cooling the heat transfer fluid. This heat transfer can cause the PCM to melt. However, because the PCM maintains its temperature during phase transition, the heat transfer fluid continues to cool. Thus, the PCM assists the cooling system in cooling the heat transfer fluid, thereby allowing for use of a lower-capacity cooling system than would otherwise be required. Furthermore, the PCM reduces peak power demand during the transient condition relative to a peak power demand of the cooling system absent the PCM. That is, in the absence of the PCM, cooling system 126 would have to perform all cooling functions, resulting in higher power consumption than with the PCM.

In the example of FIG. 5, heating loop 110 includes tubing to transport liquid to and from a test slot or a pack of test slot in a circulating loop. As with the cooling loop, the tubing is made of a thermally-conductive material, such as metal, which permits transmission of heat between the liquid contained therein and PCM 122. The liquid may be any appropriate heat transfer fluid that is capable of transferring heat to PCM 122, thereby heating the PCM. Examples of heat transfer fluids that may be used include, but are not limited to, water, ethylene glycol, hydrofluoroether (HFE), or appropriate combinations thereof. For example, in an implementation, the heat transfer fluid is a mixture of water and ethylene glycol containing 60% ethylene glycol and 40% water. In other implementations, the heat transfer fluid may be a mixture of water and ethylene glycol containing 50% ethylene glycol and 50% water, or some other percentages.

The tubing containing the liquid passes proximate to PCM 122 to allow heat transfer to occur between the liquid and the PCM. For example, the tubing may pass through the PCM such that the tubing is surrounded by the PCM. During the steady state condition, the liquid in the tubing imparts heat to the PCM. As a result, during the steady state condition, the PCM melts, absorbs heat, and increases in temperature to a target (e.g., maximum) temperature. In this way, the PCM is thermally charged during the steady-state condition. More specifically, in this example, the heating system heats the liquid. The heated liquid passes through the thermally-conductive tubing, which passes in proximity to (e.g., through or around) PCM 122. The heated liquid imparts heat to the PCM over time, during the steady state condition, causing the PCM to melt and to maintain a steady-state temperature. Because the PCM is heated over a relatively long period of time (e.g., the duration of the steady state condition), the capacity of the heating system need not accommodate spikes in demand, such as those which may occur during transient conditions. As a result, the heating system can be of lower capacity. For example, the heating system may be smaller in size and less costly than heating systems that have to accommodate spikes in demand that may occur during the transient condition.

Heating system 131 may include any appropriate heater or heaters that are capable of heating the liquid to a temperature that is sufficient to enable the liquid to impart heat to the PCM. In some implementations, the heating system may include an electrical heater, although other types of heaters may be used. In an example implementation, the heating system heats the liquid as it passes through the system.

Any appropriate PCM may be used in the heating loop. The PCM may include hydrated salts or organic compounds that have an amount of heat energy stored in the form of latent heat, which is absorbed or released when the materials change state from solid to liquid or liquid to solid. The PCM in the heating loop may be different than the PCM in the cooling loop due, at least in part, to the different roles that the two play. That is, the PCM in the cooling loop is brought to a desired minimum temperature, and extracts heat from the heat transfer liquid in order to cool the liquid during transient conditions. The PCM in the heating loop is brought to a desired maximum temperature, and imparts heat to the transfer liquid in order to heat the liquid during transient conditions. The PCM may be encapsulated in a polymer, such as polypropylene (PP) or high-density polyethylene (HDPE), or a metal, such as copper or stainless steel.

Referring to FIG. 1, tubing from heating loop 110 is adjacent to (e.g., in contact with) thermally-conductive structure 108. As a result, when heated, the liquid in the tubing imparts heat to thermally-conductive structure 108, thereby heating thermally-conductive structure 108 to an appropriate high (e.g., desired maximum) temperature.

The heating loop is operated in response to a transient condition. For example, the transient condition may be that the DUT in the test slot is to be heated to a specified maximum temperature at a specified rate (e.g., between 3° C./minute and 15° C./minute). In response, the heating loop may be controlled, e.g., by a central computing device, to cause the heating. For example, heating system 131 may be controlled to heat the heat transfer fluid, and to pump that fluid through the heating loop. The liquid passes in proximity to (e.g., through or around) PCM 122, which has been previously heated to a predefined temperature. Heat transfers from the PCM to the heat transfer fluid, thereby increasing the temperature of the heat transfer fluid. This heat transfer away from the PCM can cool the PCM and cause the PCM to solidify. However, because the PCM maintains its temperature during phase transition, the heat transfer fluid remains heated. Thus, the PCM assists heating system 131 in heating the heat transfer fluid, thereby allowing for use of a lower-capacity heating system than would otherwise be required. Furthermore, the PCM reduces peak power demand during the transient condition relative to a peak power demand of the heating system absent the PCM. That is, in the absence of the PCM, heating system 131 would have to perform all heating functions, resulting in higher power consumption than with the PCM.

In some implementations, the temperature control system and variants thereof described herein may be used to control the temperature of a single test slot. In some implementations, the temperature control system and variants thereof described herein may be used to control the temperature of a multiple test slots. For example, each test slot in a pack 102 of test slots may have a configuration of the type shown in FIGS. 1 to 3. The temperature of liquid flowing, via tubing, to the different test slots may be controlled by common heating and/or cooling loops. For example, a single PCM and cooling system may service multiple test slots, and a single PCM and heating system may service multiple test slots. Alternatively, the temperature of liquid flowing, via tubing, to the different test slots may be controlled by slot-dedicated heating and/or cooling loops. For example, each test slot may be serviced by a dedicated PCM and cooling system and/or by a dedicated PCM and heating system.

Testing performed by the example test system described herein may be implemented using hardware or a combination of hardware and software. For example, a test system like the ones described herein may include various controllers and/or processing devices located at various points in the system to control operation. A central computer may coordinate operation among the various controllers or processing devices. The central computer, controllers, and processing devices may execute various software routines to control and coordinate temperature control of one or more test slots using the methods and structures described herein.

The temperature control system described herein may be controlled by one or more computers, e.g., by sending signals to and from one or more wired and/or wireless connections to each test slot to control each blower, and to control the heating and cooling systems. The testing can be controlled, at least in part, using one or more computer program products, e.g., one or more computer program tangibly embodied in one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) may include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any electrical connection involving transfer of signals may imply a direct physical connection or a wired or wireless connection that includes intervening components but that nevertheless allows electrical signals to flow between connected components. Any connection of electrical circuitry that enables signals to pass, unless stated otherwise, is an electrical connection and not necessarily a direct physical connection regardless of whether the word electrical is used to modify connection.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
a test slot to hold a device under test (DUT);

a temperature control system; and an air mover to direct air over a thermally-conductive structure and towards the DUT in the test slot in order to affect a temperature of the DUT;

wherein the temperature control system comprises a cooling loop to reduce the temperature of the thermally-conductive structure, the cooling loop comprising a first phase-change material, the first phase-change material being thermally charged during a first steady-state condition, with the first phase-change material changing phase during a first transient condition, the first steady-state condition being longer in duration than the first transient condition;

wherein the temperature control system comprises a heating loop to increase the temperature of the thermally-conductive structure, the heating loop comprising a second phase-change material, the second phase-change material being thermally charged during a second steady-state condition, with the second phase-change material changing phase during a second transient condition, the second steady-state condition being longer in duration than the second transient condition;

wherein the cooling loop and the heating loop operate out of phase, and wherein the cooling loop and the heating loop comprise separate temperature control loops.

2. The test system of claim 1, wherein the cooling loop comprises:

tubing to transport liquid to and from the test slot, the tubing containing the liquid passing proximate to the first phase-change material to allow the first phase-change material to cool the liquid, the first phase change material melting to cool the liquid during the first transient condition; and a cooling system to cool the liquid.

3. The test system of claim 2, wherein the tubing containing the liquid passes through or around to the first phase-change material.

4. The test system of claim 1, wherein the temperature control system is configured to actively control a temperature of a liquid passing in proximity to the first phase-change material to enable the thermally-conductive structure to reach a minimum temperature during the first transient condition; and wherein the cooling system is configured to cool the phase-change material during the first steady-state condition.

5. The test system of claim 4, wherein the cooling system has a capacity that is less than would be required to enable the thermally-conductive structure to reach the minimum temperature during the transient condition absent the first phase-change material.

6. The test system of claim 2, wherein the liquid in the tubing comprises a heat transfer fluid.

7. The test system of claim 1, wherein the heating loop comprises:

tubing to transport liquid to and from the test slot, the tubing containing the liquid passing proximate to the second phase-change material to allow the second phase-change material to add heat to the liquid, the second phase change material solidifying to add the heat to the liquid during the second transient condition; and a heating system to heat the liquid.

8. The test system of claim 7, wherein the tubing containing the liquid passes through or around to the second phase-change material.

9. The test system of claim 1, wherein the temperature control system is configured to actively control a temperature of a liquid in proximity to the second phase-change material to enable the thermally-conductive structure to reach a maximum temperature during the second transient condition; and wherein the heating system is configured to add the heat to the second phase-change material during the second steady-state condition.

10. The test system of claim 9, wherein the heating system has a capacity that is less than would be required to enable the thermally-conductive structure to reach the maximum temperature during the second transient condition absent the second phase-change material.

11. The test system of claim 9, wherein the liquid comprises a heat transfer fluid.

12. The test system of claim 1, wherein the thermally-conductive structure comprises one or more metal plates; and wherein the test slot comprises a shroud to direct air from the air mover over the DUT.

13. The test system of claim 1, wherein the first phase-change material or the second phase-change material comprises a hydrated salt or an organic compound.

14. The test system of claim 1, further comprising:

a group of test slots, which includes the test slot holding the DUT;

wherein each test slot in the group of test slots comprises a thermally-conductive structure having a temperature that is affected by a temperature of the first phase-change material or the second phase change material; and wherein each test slot in the group of test slots comprises an air mover to direct air over a corresponding thermally-conductive structure and towards a DUT in order to affect a temperature of the DUT.

15. The test system of claim 1, further comprising:

a temperature sensor to detect a temperature of the DUT; and a control loop to control operation of the air mover based on the temperature detected.

16. The test system of claim 1, wherein the temperature control system enables the thermally-conductive structure to reach a target temperature at a quicker rate during the first or second transient condition than would be reached by the temperature control system absent phase-change material.

17. The test system of claim 1, wherein the temperature control system reduces peak power demand during the first or second transient condition relative to a peak power demand of the temperature control system absent phase-change material.

18. A temperature control system for one or more test slots, comprising:

a cooling loop for one or more test slots, the cooling loop comprising a first liquid and a first phase-change material, the first phase-change material to remove heat from the first liquid during a first transient condition, the cooling loop comprising a cooling system to cool the first liquid during a first steady-state condition, the first steady state condition is longer in duration than the first transient condition; and a heating loop for one or more test slots, the heating loop comprising a second liquid and a second phase-change material, the second phase-change material to add heat to the second liquid during a second transient condition, the heating loop comprising a heating system to add heat to the second liquid during a second steady-state condition, the second steady state condition is longer in duration than the second transient condition;

wherein the cooling loop and the heating loop are controlled to operate out of phase, and wherein the cooling loop and the heating loop comprise separate temperature control loops.

19. The temperature control system of claim 18, wherein each test slot comprises:
   a thermally-conductive structure having a temperature that is controlled by the heating loop or the cooling loop; and
   an air mover to direct air over the thermally-conductive structure and towards a device in the test slot in order to affect a temperature of the device.

20. The temperature control system of claim 19, wherein the cooling system has a capacity that is less than would be required to enable the thermally-conductive structure to reach a minimum temperature during the first transient condition absent the first phase-change material.

21. The temperature control system of claim 19, wherein the heating system has a capacity that is less than would be required to enable the thermally-conductive structure to reach a maximum temperature during the second transient condition absent the second phase-change material.

22. The temperature control system of claim 18, wherein the first phase-change material is different from the second phase-change material.

23. The temperature control system of claim 19, wherein the cooling loop is controlled to cool the device at a rate between 3° C. per minute and 15° C. per minute, inclusive; and
   wherein the heating loop is controlled to heat the device at a rate between 3° C. per minute and 15° C. per minute, inclusive.

24. The temperature control system of claim 19, wherein the cooling loop is controlled to cool the device at a rate of 10° C. per minute; and
   wherein the heating loop is controlled to heat the device at a rate of 10° C. per minute.

25. The temperature control system of claim 18, wherein the first phase-change material has a composition that enables reaching a temperature of −23° C.; and
   wherein the second phase-change material has a composition that enables reaching a temperature of +80° C.

* * * * *